United States Patent
Chang et al.

(10) Patent No.: US 10,593,735 B2
(45) Date of Patent: Mar. 17, 2020

(54) DIODE DEVICE AND METHOD FOR MANUFACTURING THE SAME, AND DIODE APPARATUS

(71) Applicant: BOE Technology Group Co., Ltd., Beijing (CN)

(72) Inventors: Shuai Chang, Beijing (CN); Haizheng Zhong, Beijing (CN); Dengbao Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/445,749

(22) Filed: Jun. 19, 2019

(65) Prior Publication Data

US 2020/0035764 A1    Jan. 30, 2020

(30) Foreign Application Priority Data

Jul. 26, 2018 (CN) .......................... 2018 1 0834224

(51) Int. Cl.
*H01L 29/40* (2006.01)
*H01L 27/32* (2006.01)
(Continued)

(52) U.S. Cl.
CPC ...... *H01L 27/3227* (2013.01); *H01L 51/4213* (2013.01); *H01L 51/502* (2013.01);
(Continued)

(58) Field of Classification Search
CPC .... H05H 1/46; H05H 1/24; H05H 1/30; H01J 37/32082; H01J 37/32192;
(Continued)

(56) References Cited

U.S. PATENT DOCUMENTS 9,899,193 B1 * 2/2018 Koo .................. H01J 27/16
10,050,202 B2 8/2018 Griffiths
(Continued)

FOREIGN PATENT DOCUMENTS

| CN | 106883383 A | 6/2017 |
| CN | 108198814 A | 6/2018 |
| KR | 10-2018-0094041 A | 8/2018 |

OTHER PUBLICATIONS

Office Action dated Nov. 25, 2019 issued in corresponding Chinese Application No. 201810834224.0.

*Primary Examiner* — Minh D A
(74) *Attorney, Agent, or Firm* — Nath, Goldberg & Meyer; Joshua B. Goldberg

(57) ABSTRACT

The present disclosure provides a diode device comprising a first electrode, a hole transport layer, a functional layer, an electron transport layer and a second electrode that are stacked, wherein the functional layer comprises at least one sub-functional layer each comprising a photo-detection layer and an electroluminescent layer which are stacked and a difference of energy barriers between the photo-detection layer and the electroluminescent layer is not more than 1.5 eV; the photo-detection layer comprises a nanocrystalline derived from a copper indium sulfide system compound, and the electroluminescent layer comprises an oil-soluble nanocrystalline. The present disclosure further provides a method for manufacturing a diode device, and a diode apparatus having both electro-luminescence and photoelectric response properties, and higher material universal applicability.

16 Claims, 5 Drawing Sheets

(51) Int. Cl.
  *H01L 51/50* (2006.01)
  *H01L 51/42* (2006.01)
  *H05B 37/02* (2006.01)
  *H05B 33/08* (2020.01)
  *H01L 51/56* (2006.01)

(52) U.S. Cl.
  CPC .......... *H01L 51/5004* (2013.01); *H01L 51/56* (2013.01); *H05B 33/0854* (2013.01); *H05B 37/0218* (2013.01); *H01L 2251/558* (2013.01)

(58) Field of Classification Search
  CPC ...... H01J 37/32174; H01J 3/021; H01J 27/16; H01J 37/08; H01J 37/3171; H01J 27/18; H01J 27/08; H01J 27/14; H01J 41/04; H01J 41/14; H01J 41/06; H01T 23/00; H01T 19/00
  See application file for complete search history.

(56) References Cited

U.S. PATENT DOCUMENTS

| | | |
|---|---|---|
| 2014/0329377 A1* | 11/2014 | Heiderman .......... H01L 21/265 438/514 |
| 2018/0069185 A1 | 3/2018 | He et al. |
| 2018/0166654 A1 | 6/2018 | Shedletsky et al. |
| 2019/0006425 A1 | 1/2019 | Kim et al. |

* cited by examiner

DIODE DEVICE AND METHOD FOR MANUFACTURING THE SAME, AND DIODE APPARATUS

TECHNICAL FIELD

The present disclosure relates to the field of electronic components, and in particular to a diode device and a method for manufacturing the same, and a diode apparatus.

BACKGROUND ART

With the development of electronic technology, designs of novel multifunctional devices based on material properties have become an emerging field in semiconductor device research. For example, many types of intelligent sensor devices may be developed by applying photoelectric response properties of materials in conjunction with designs of circuit constituted by electrical devices and of programming.

However, dual-function devices having electro-luminescence and photoelectric response properties provided in the prior art are all manufactured by using a double heterojunction nanorod as an active material, so the process is complex and the universal applicability of the material is low.

How to simplify the process for manufacturing a dual-function device having electro-luminescence and photoelectric response properties has become a technical problem necessary to be solved in the art.

SUMMARY

The present disclosure is directed to provide a diode device and a method for manufacturing the same, and a diode apparatus.

In a first aspect, the present disclosure provides a diode device including a first electrode, a hole transport layer, a functional layer, an electron transport layer and a second electrode which are stacked, wherein the functional layer includes at least one sub-functional layer each including a photo-detection layer and an electroluminescent layer which are stacked, and difference of energy barriers between the photo-detection layer and the electroluminescent layer is not more than 1.5 eV;

the photo-detection layer includes a nanocrystalline derived from a copper indium sulfide compound; and the electroluminescent layer includes an oil-soluble nanocrystalline.

Optionally, the copper indium sulfide compound includes any one of $CuInS_2$, $CuInSe_2$, $CuInS_xSe_{2-x}$, $CuInZn_yS_{2+y}$, $CuIn_yGa_{1-y}Se_2$ and the combinations thereof, wherein $0<x<2$ and $0<y<1$.

Optionally, the first electrode includes a transparent electrode material, and the second electrode includes a conductive metal material.

Optionally, the photo-detection layer has a thickness of 20 nm to 1000 nm, and the electroluminescent layer has a thickness of 20 nm to 1000 nm.

In a second aspect, the present provides a diode apparatus including at least one diode device provided by the present disclosure.

Optionally, the diode apparatus further includes a power supply, a trigger and a switch.

An input end of the trigger is electrically coupled to the second electrode; a first output end of the trigger is electrically coupled to the first electrode; a second output end of the trigger is electrically coupled to a control end of the switch; and the switch could be turned on when receiving a photo current from the second output end of the trigger.

An output end of the power supply is electrically coupled to the first end of the switch, an input end of the power supply is electrically coupled to the second electrode, and the second end of the switch is electrically coupled to the first electrode.

Optionally, the power supply is capable of providing a pulse signal. The diode apparatus further includes an adjuster capable of adjusting a high-level voltage value of the pulse signal from the power supply according to a value of a photo current provided by the diode device in a state of a low-level pulse signal.

In a third aspect, the present disclosure provides a method for manufacturing a diode device including:

forming a first electrode;

forming a hole transport layer;

forming a functional layer on the hole transport layer which includes at least one sub-functional layer, wherein each sub-functional layer includes a photo-detection layer and an electroluminescent layer which are stacked, and difference of energy barrier between the photo detection layer and the electroluminescent layer is not more than 1.5 eV;

forming an electron transport layer on the functional layer; and forming a second electrode, wherein the photo detection layer includes nanocrystalline derived from a copper indium sulfide compound.

Forming the sub-functional layer includes:

forming a copper indium sulfide compound layer by using an alcohol-soluble phase inversion method to obtain the photo detection layer; and forming an oil-soluble nanocrystalline layer on the photo detection layer to obtain the electroluminescent layer.

Optionally, the copper indium sulfide compound includes any one of $CuInS_2$, $CuInSe_2$, $CuInS_xSe_{2-x}$, $CuInZn_yS_{2+y}$, $CuIn_yGa_{1-y}Se_2$ and the combinations thereof, wherein $0<x<2$ and $0<y<1$.

Optionally, the first electrode includes a transparent electrode material, and the second electrode includes a conductive metal material.

Optionally, the alcohol-soluble phase inversion method is selected from the group consisting of a 6-mercaptohexanol ligand exchange method, a 2-mercapto-3-butanol ligand exchange method, a 3-mercapto-1-propanol ligand exchange method or a 2,3-dimercaptopropanol ligand exchange method.

Optionally, the photo detection layer has a thickness of 20 nm to 1000 nm, and the electroluminescent layer has a thickness of 20 nm to 1000 nm.

BRIEF DESCRIPTION OF THE DRAWINGS

The accompanying drawings are intended to provide a further understanding of the present disclosure, constitute a part of the description, and are used for interpreting the present disclosure together with the following specific embodiments, rather than limiting the present disclosure. In the drawings.

| Reference signs: | |
|---|---|
| 100: diode device | 101: sub-functional layer |
| 1011: photo detection layer | 1012: electroluminescent layer |
| 102: hole transport layer | 1021: first hole transport sub-layer |
| 1022: second hole transport sub-layer | 103: electron transport layer |
| 104: first electrode | 105: second electrode |
| 200: control circuit | |

DETAILED DESCRIPTION OF THE EMBODIMENTS

The present disclosure will be further described in detail with reference to the accompanying drawings and specific embodiments. It should be understood that the specific embodiments described herein are merely used for illustrating and interpreting the present disclosure, rather than limiting the present disclosure.

Figure 1A:
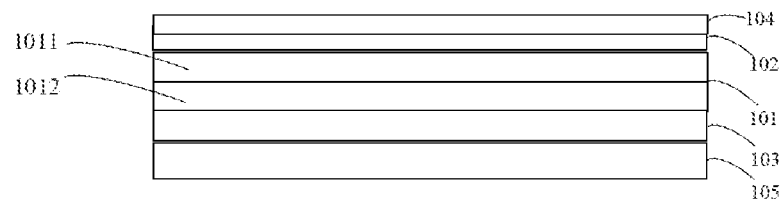
FIG. 1A is a structure diagram of a diode device according to the present disclosure.
Figure 1B:
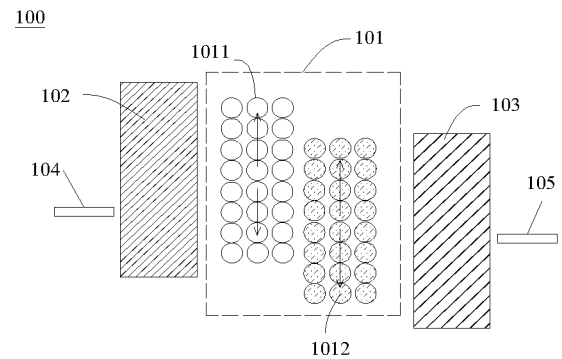
FIG. 1B is a schematic diagram of an energy level structure of the diode device in FIG. 1A.

In a first aspect, the present disclosure provides a diode device 100, as shown in FIGS. 1A and 1B, including a first electrode 104, a hole transport layer 102, a functional layer including at least one sub-functional layer 101, an electron transport layer 103 and a second electrode 105 which are stacked. Each sub-functional layer 101 includes a photo detection layer 1011 and an electroluminescent layer 1012 which are stacked, and difference of energy barrier between the photo detection layer 1011 and the electroluminescent layer 1012 is not more than 1.5 eV.

It should be noted that number of the sub-functional layers is not limited in the present disclosure, and may be one or more. As a preferred embodiment, the functional layer in FIG. 1A includes only one sub-functional layer 101. The sub-functional layer 101 is located between the hole transport layer 102 and the electron transport layer 103 and includes a photo-detection layer 1011 and an electroluminescent layer 1012 that are stacked.

In order to enable the diode device 100 to have both photo detection and electroluminescence properties, the difference of energy barriers between the photo-detection layer 1011 and the electroluminescent layer 1012 is required to be not more than 1.5 eV. The difference of energy barriers being not more than 1.5 eV may ensure the following functions:

in a photo detection mode, carriers in the photo detection layer 1011 may be separated and transported, so as to form and output photocurrent; and in a light emission mode, carriers may be injected into the electroluminescent layer 1012, so as to make the electroluminescent layer 1012 emit light. That is to say, the diode device 100 may be turned on and emit light after bias is applied to it, and the diode device 100 may output photo current when receiving light.

It is easily understood that the first electrode 104 and the second electrode 105 are provided to apply bias to the diode device, so that the diode device 100 is capable of emitting light and realizes a photo detection function, wherein the photo detection function of the diode device 100 is realized by outputting photo current, i.e. a light intensity is determined according to the magnitude of the photo current.

Based on the above, the diode device provided by the present disclosure has photo detection and electroluminescence properties, and thus it can be used for manufacturing intelligent sensor devices and applied in the fields of display and illumination technologies.

In the present disclosure, the photo-detection layer includes nanocrystalline derived from a copper indium sulfide compound, and the electroluminescent layer includes oil-soluble nanocrystalline.

It should be noted that a copper indium sulfide compound is selected as the raw material forming the photo-detection layer in the present disclosure for its good photoelectric conversion property. Moreover, the copper indium sulfide compound has higher universal applicability when compared with the prior art.

In addition, because the oil-soluble nanocrystalline would not corrode the nanocrystalline derived from the copper indium sulfide compound, the electroluminescent layer made of the oil-soluble nanocrystalline would not cause miscibility between the photo detection layer and the electroluminescent layer, thereby ensuring structural stability of the diode device.

As a preferred embodiment of the present disclosure, the copper indium sulfide compound includes any one of $CuInS_2$, $CuInSe_2$, $CuInS_xSe_{2-x}$, $CuInZn_yS_{2+y}$, $CuIn_yGa_{1-y}Se_2$ and the combinations thereof, wherein $0<x<2$ and $0<y<1$; and the oil-soluble nanocrystalline includes any one of CdSe, CdS and InP.

Moreover, in the present disclosure, the hole transport layer includes PEDOT:PSS, and any one of TFB, PVK, Poly-TPD, CBP, NiOx and the combinations thereof; and the electron transport layer includes any one of ZnO, ZnMgO, $TiO_2$ and the combinations thereof.

It should be noted that positional relationships among the hole transport layer, the functional layer and the electron transport layer is not specifically limited in the present disclosure. Specifically, FIGS. 1A and 1B are shown just as a preferred embodiment. When the hole transport layer 102 includes PEDOT:PSS and TFB and the electron transport layer includes ZnO, the photo detection layer 1011 of the functional layer is in contact with the hole transport layer 102 and the electroluminescent layer 1012 of the functional layer is in contact with the electron transport layer 103.

In the present disclosure, the first electrode 104 includes a transparent electrode material and the second electrode 105 includes a conductive metal material.

As a preferred embodiment, the transparent electrode material may be a mesh of silver nanowire, ITO or FTO; and the conductive metal material may be aluminum, gold, silver or the like.

In the present disclosure, the photo detection layer has a thickness of 20 nm to 1000 nm, and the electroluminescent layer has a thickness of 20 nm to 1000 nm.

It should be noted that an electroluminescent region of the diode device may be formed in the layer formed by the oil-soluble nanocrystalline by adjusting the thicknesses of the layers formed by the copper indium sulfide compound and the oil-soluble nanocrystalline.

In another aspect, the present disclosure provides a diode apparatus including at least one diode device provided by the present disclosure.

Figure 2A:
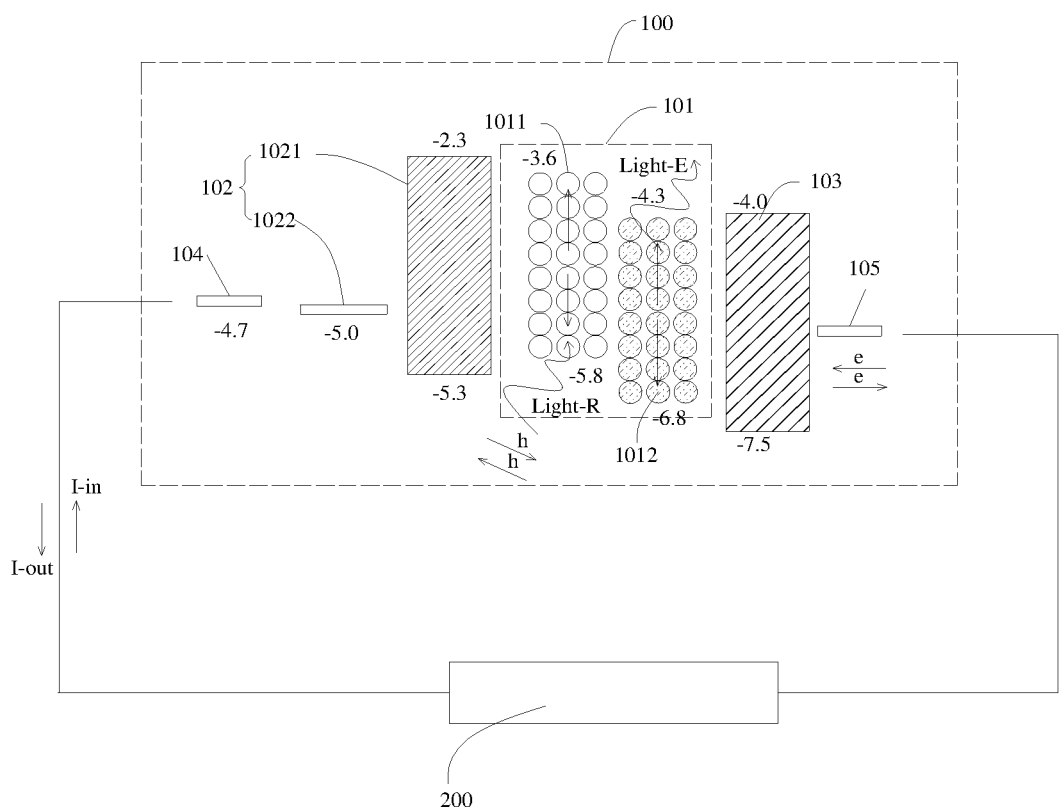
FIG. 2A is a structure diagram of a diode apparatus according to the present disclosure.
Figure 2B:
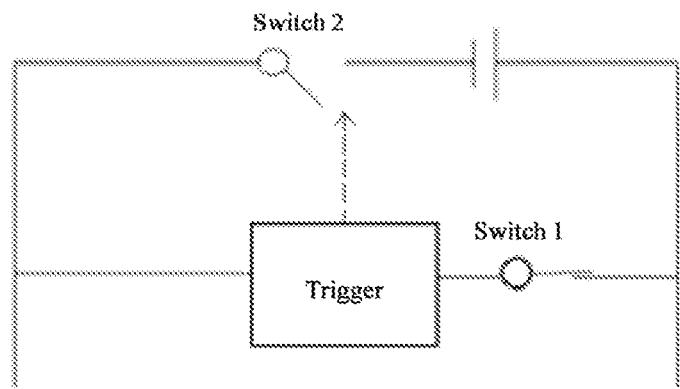
FIG. 2B is a schematic diagram of the control circuit in FIG. 2A.

As a preferred embodiment shown in FIGS. 2A and 2B, the diode apparatus includes a diode device 100 and the functional layer therein includes one sub-functional layer 101, wherein the hole transport layer 102 includes a first hole transport sub-layer 1021 and a second hole transport sub-layer 1022 which are stacked; the sub-functional layer 101 is located between the first hole transport sub-layer 1021 and the electron transport layer 103; the first electrode 104 is located on the side of the second hole transport sub-layer 1022 away from the first hole transport sub-layer 1021; and the second electrode 105 is located on the side of the electron transport layer 103 away from the sub-functional layer 101.

Further, in the above embodiment, the first hole transport sub-layer 1021 is made of TFB, the second hole transport sub-layer 1022 is made of PEDOT, and the electron transport layer 103 is made of ZnO. Moreover, in the sub-functional layer 101, the photo detection layer 1011 made of a copper indium sulfide compound is close to the first hole transport sub-layer 1021, and the electroluminescent layer 1012 made of oil-soluble nanocrystalline is close to the electron transport layer 103. Further, the first electrode 104 is made of ITO, and the second electrode 105 is made of metal aluminum.

Further, in the above embodiment, the first electrode 104 has a work function of −4.7 eV; the second electrode 105 has a work function of −4.3 eV; the hole transport layer 102 has a work function on the conduction band bottom of −2.3 eV and a work function on the valence band top of −5.3 eV; the electron transport layer 103 has a work function on the conduction band bottom of −4.0 eV and a work function on the valence band top of −7.5 eV; the photo-detection layer 1011 has a work function on the conduction band bottom of −3.6 eV and a work function on the valence band top of −5.8 eV; and the electroluminescent layer 1012 has a work function on the conduction band bottom of −4.3 eV and a work function on the valence band top of −6.8 eV.

In the present disclosure, as shown in FIGS. 2A and 2B, the diode apparatus further includes a control circuit 200 comprising a power supply, a trigger and a switch, wherein an input end of the trigger is electrically coupled to the second electrode 105; a first output end of the trigger is electrically coupled to the first electrode 104; a second output end of the trigger is electrically coupled to a control end of the switch; the switch is turned on when receiving photo current from the second output end of the trigger; an output end of the power supply is electrically coupled to the first end of the switch; an input end of the power supply is electrically coupled to the second electrode 105; and the second end of the switch is electrically coupled to the first electrode 104.

Figure 3:
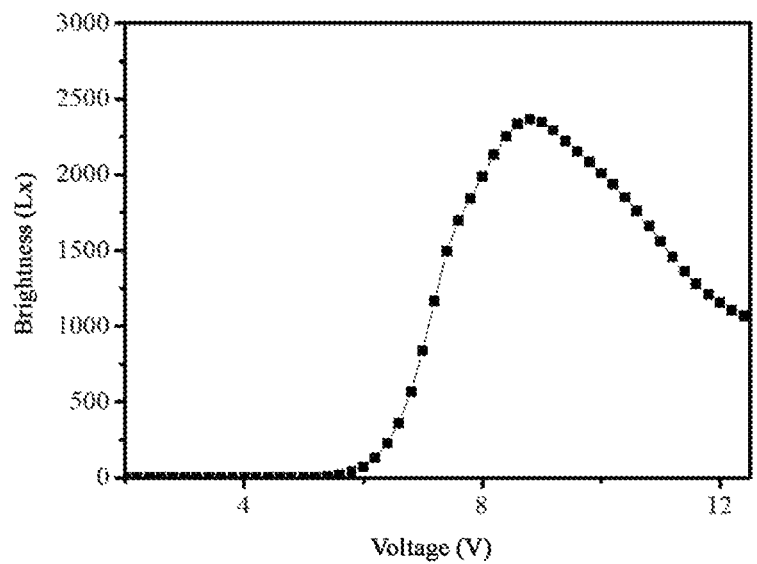
FIG. 3 is a schematic diagram showing a correlative curve between a voltage applied to the diode device according to the present disclosure and a brightness of a light emitted by the diode device.

It should be noted that, when the power supply is used to apply a forward bias to the diode device 100, the diode device 100 is turned on and the electroluminescent layer 1012 can emit Light-E, thereby obtaining a voltage brightness curve shown in FIG. 3. As shown in FIG. 3, when the forward bias applied to the two ends of the diode device 100 reaches about 9 V, the brightness of the light emitted by the diode device 100 reaches a peak value.

During applying the forward bias to the diode device 100 to emit light, hole carriers h inside the sub-functional layer are transported from the hole transport layer to the electron transport layer. In an external circuit that the power supply is electrically coupled to the diode device 100, electron carriers e are transported from the second electrode 105 to the first electrode 104 of the diode device 100 and the injection current I-in output by the power supply has a direction from the output end of the power supply to the first electrode 104.

Figure 4:
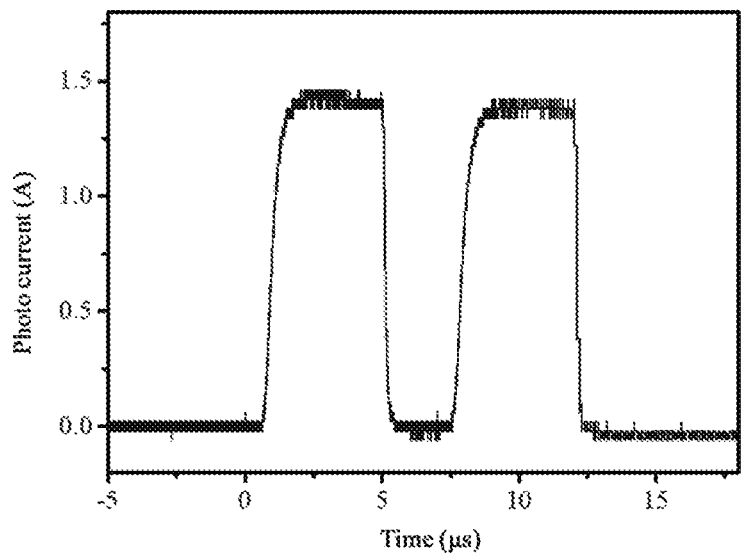
FIG. 4 is a schematic diagram showing a photo current vs. time curve of the diode device according to the present disclosure.

When the power supply is used to apply a reverse bias or zero bias to the diode device 100 and the Light-R received by the diode device 100 is adjusted, the diode device turned off and does not emit light, but the photo current output by the diode device 100 may be measured, thereby obtaining a photo current-time relationship diagram shown in FIG. 4. It is easily understood that the diode device 100 outputs photo current in the period of receiving light, whereas it does not output photo current in the period of not receiving light.

When the diode device 100 receives the light to form photo current, hole carriers h inside the sub-functional layer are transported from the electron transport layer to the hole transport layer. In the external circuit that the power supply is electrically coupled to the diode device 100, electron carriers e are transported from the first electrode 104 to the second electrode 105 of the diode device 100 and the photo current I-out output by the diode device 100 has a direction from the first electrode 104 to the output end of the power supply.

It is further noted that the diode device 100, the power supply and the switch form a first loop and the trigger and the diode device 100 form a second loop; wherein the first loop and the second loop are connected in parallel, and the second output end of the trigger is electrically coupled to the control end of the switch.

Based on the above description, taking FIGS. 2A and 2B as an example, the working process of the diode apparatus according to the present disclosure is described as follows.

In the initial state (no power is applied) of the diode apparatus, the second loop is closed and the first loop is open.

Because the copper indium sulfide nanocrystalline has a good photoelectric conversion property, the photo detection layer 1011 made thereof has a good photovoltaic property. Therefore the photo detection layer 1011 implements photoelectric conversion when receiving light, so that the diode device 100 in the second loop outputs photo current. The trigger measures the photo current, and controls the switch according to the measured value of the photo current. After the switch is turned on, the power supply applies a forward bias to the diode device 100, so that the diode device 100 is turned on to emit light.

When the switch is not turned on, since the photo detection layer 1011 could implement photoelectric conversion when receiving light, carriers of certain concentration are formed inside the diode device 100, and thereby forming a weak current. The trigger is capable of measuring the weak current, but the carriers of certain concentration do not cause the electroluminescent layer 1012 to emit light, so the diode device 100 does not emit light in the photo detection phase.

Based on the above principle, as a preferred embodiment of the present disclosure, when the photo current measured by the trigger is greater than a preset threshold, the trigger outputs a control signal for controlling the switch to be turned on, so that the power supply applies a bias to the diode device 100 and then the diode device is turned on to emit light.

In the present disclosure, the power supply is capable of outputting a pulse signal, and the diode apparatus further includes an adjuster capable of adjusting a high level voltage value of the pulse signal output by the power supply according to the photo current value output by the diode device in a low level state of the pulse signal.

As described above, the diode apparatus provided by the present disclosure is capable of changing its own brightness according to the brightness of light in the surrounding environment.

Specifically, the pulse signal output by the power supply includes a high level of the pulse signal and a low level of the pulse signal, wherein the diode device emits light in a high level phase and does not emit light in a low level phase. Based on this, when the diode apparatus is placed in a light environment, the trigger measures the photo current of the diode device in the low level phase (the magnitude of the photo current reflects the brightness of environmental light irradiating to the diode apparatus) and sends the photo current to the adjuster. The adjuster adjusts the high level voltage value of the pulse signal output by the power supply according to the received photo current. When the power supply outputs a high level again, the voltage value of the high level is the adjusted voltage value, and thus the brightness of the diode apparatus can be changed by itself according to the brightness of the environmental light. For example, within a reasonable range such as 0-9 V voltage applied to the diode device, the environmental light is brighter, the photo current formed by the diode device is higher. And then the adjuster increases the voltage value of the high level, so that the brightness of the light emitted by the diode device increases, and vice versa.

Figure 5:
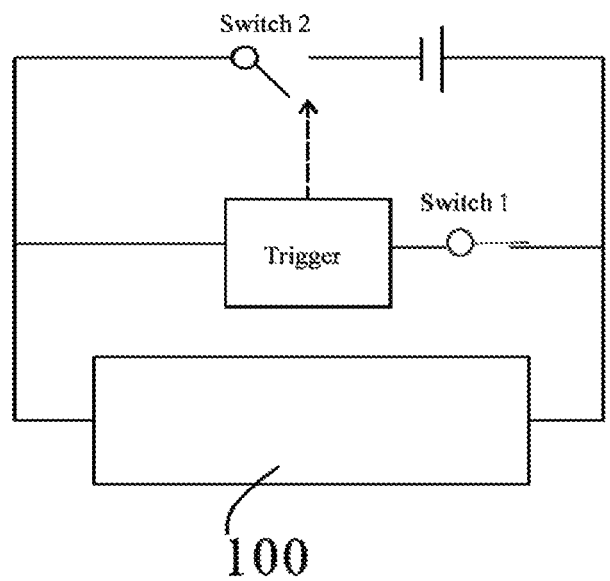
FIG. 5 is a schematic diagram showing a circuit for testing photosensitive turn-on of the diode apparatus according to the present disclosure.
Figure 6:
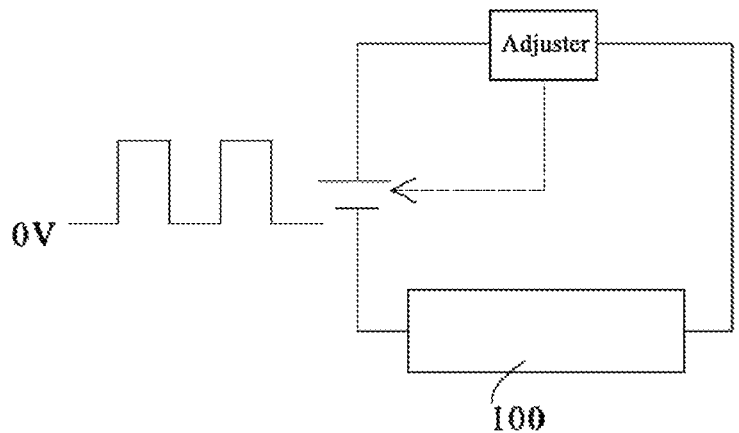
FIG. 6 is a schematic diagram showing a circuit for testing automatic dimming of the diode apparatus according to the present disclosure.

FIG. 5 and FIG. 6 are schematic diagrams of circuits for testing the diode apparatus. the circuit shown in FIG. 5 tests the photosensitive turn-on of the diode device. Specifically, an ammeter A is used to measure the threshold of photo current of the diode device. When the photo current reaches the threshold, the trigger controls the switch to be turned on, so that the power supply applies a bias to the diode device so as to make it be turned on and emit light.

The circuit shown in FIG. 6 tests the automatic dimming performance of the diode device. The low level of the pulse signal is set to 0 V. In the low level phase, the ammeter A measures the photo current of the diode device, and the adjuster adjusts the voltage value of the high level of the pulse signal according to the measured photo current and a bias based on the voltage value is applied to the diode device to make it emit light.

Through the above tests, a photosensitive turn-on condition (such as the threshold of the photo current) of the diode apparatus and related parameters (such as relationship table for brightness of the environmental light, photo current value, and high level voltage value of the pulse signal) for automatically adjusting its own brightness according to the environmental light may be obtained.

In the present disclosure, the specific application of the diode apparatus is not particularly limited. For example, the diode apparatus can be used for optical communication, a sensor or a display apparatus.

Specifically, when the diode device is used for optical communication, the photo detection layer of the diode device in the diode apparatus may receive an optical signal and then would emit light of corresponding intensity according to the received optical signal, thereby realizing transmission of the optical signal.

Figure 7:
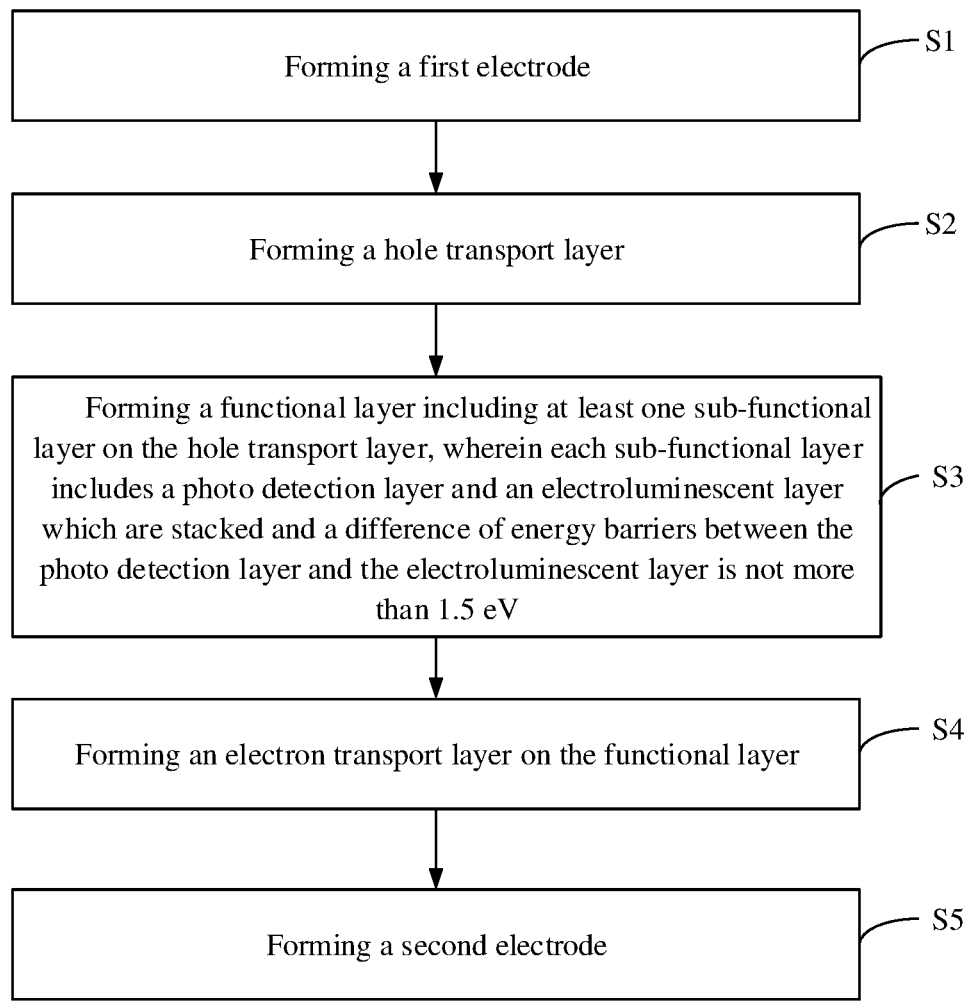
FIG. 7 is a flow diagram of a method for manufacturing a diode device according to the present disclosure.

As yet another aspect, the present disclosure provides a method for manufacturing a diode device, as shown in FIG. 7, including:

Step S1, forming a first electrode;
Step S2, forming a hole transport layer;
Step S3, forming a functional layer including at least one sub-functional layer on the hole transport layer, wherein each sub-functional layer includes a photo detection layer and an electroluminescent layer which are stacked and a difference of the energy barriers between the photo detection layer and the electroluminescent layer is not more than 1.5 eV;
Step S4, forming an electron transport layer on the functional layer; and
Step S5, forming a second electrode.

As described above, the method including Steps S1 to S5 is used to manufacture the diode device according to the present disclosure. The working principle and advantageous effects of the diode device have been described in the corresponding portions, and are not described here again.

In Step S1, the first electrode optionally includes a transparent electrode material.

In Step S2, the hole transport layer is formed on the first electrode.

Figure 8:
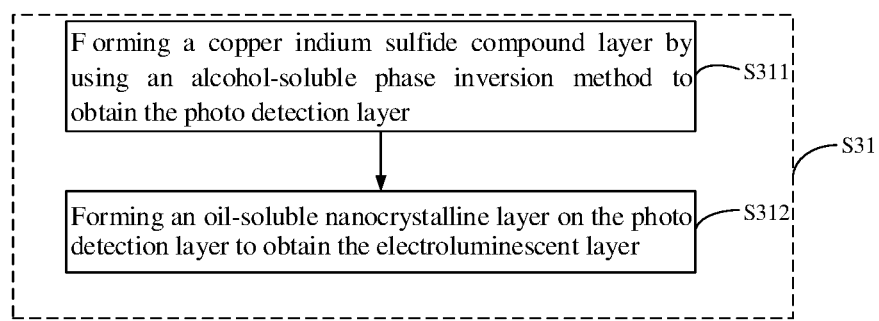
FIG. 8 is a specific flow diagram of step S3 in FIG. 7.

Further, Step S3 includes a Step S31 of forming a sub functional layer. As shown in FIG. 8, step S31 may include:

Step S311, coating a photo detection layer solution including a first solvent and a nanocrystalline derived from a copper indium sulfide compound; and
Step S312, coating an electroluminescent solution including a second solvent and an oil-soluble nanocrystalline;
wherein the first solvent and the second solvent are orthogonal to each other.

The photo detection layer includes a nanocrystalline derived from a copper indium sulfide compound which has higher universality. The nanocrystalline derived from the copper indium sulfide compound may be prepared easily by an alcohol-soluble phase inversion method. The alcohol-soluble phase inversion method may be selected from the group consisting of a 6-mercaptohexanol ligand exchange method, a 2-mercapto-3-butanol ligand exchange method, a 3-mercapto-1-propanol ligand exchange method or a 2,3-dimercaptopropanol ligand exchange method. The above method simplifies the preparation process and is beneficial to manufacturing the photo detection layer.

When the copper indium sulfide compound is $CuInS_2$, Step S311 may include: mixing zinc acetate, oleylamine and dodecyl mercaptan with a predetermined proportion and heating at 130° C. to obtain a zinc stock solution, wherein the oleylamine and the dodecyl mercaptan have a volume ratio of 1:3, and each 20 ml of oleylamine corresponds to 30 mmol of zinc acetate;

mixing copper iodide, indium acetate, dodecyl mercaptan, oleic acid and octadecene with a predetermined proportion and degassing under vacuum for 20 minutes to obtain a mixed solution including a $CuInS_2$ core structure; wherein the dodecyl mercaptan, the oleic acid and the octadecene have a volume ratio of 2:1:20, and each 10 ml of dodecyl mercaptan corresponds to 4 mmol of copper iodide and 16 mmol of indium acetate;

heating the mixed solution to 230° C. under the protection of nitrogen flow and keeping the reaction for 15 minutes;

injecting the zinc stock solution into the mixed solution at a speed of 1 ml/min to obtain a corresponding reaction solution, thereby cladding the CuInS2 core structure;

cooling the reaction solution to 180° C., injecting a predetermined amount of 6-mercaptohexanol into the reaction solution in one step and keeping the reaction for 15 minutes to complete in-situ ligand exchange to obtain a copper indium sulfide nanocrystalline mixed solution, wherein each 80 ml of the zinc stock solution corresponds to 200 mmol of 6-mercaptohexanol; and extracting the nanocrystalline mixed solution 2 to 3 times with n-hexane to obtain a copper indium sulfide nanocrystalline, and drying the copper indium sulfide nanocrystalline for 15 minutes at 60° C. to obtain a $CuInS_2/ZnS$ nanocrystalline material.

Optionally, the copper indium sulfide compound includes any one of $CuInS_2$, $CuInSe_2$, $CuInS_xSe_{2-x}$, $CuInZn_yS_{2+y}$, $CuIn_yGa_{1-y}Se_2$ and the combinations thereof, wherein 0<x<2 and 0<y<1.

The photo detection layer and the electroluminescent layer are prepared by coating with orthogonal solvents to avoid miscibility between the two layers. As understood in the art, for example, when a material is soluble in A but insoluble in B, A and B are orthogonal solvents. Those skilled in the art may select the appropriate first solvent and second solvent as needed, as long as the two solvents meet the requirements of orthogonal solvents. For example, the first solvent used for the photo detection layer may be an alcohol-soluble solvent, such as isopropanol, DMF (N,N-dimethylformamide), ethanol or methanol. The second solvent used for the electroluminescent layer may be a hydrocarbon solvent such as n-octane, n-heptane, or n-hexane.

In Step S5, the second electrode is formed on the hole transport layer and the second electrode optionally includes a conductive metal material. For example, the metal material may be Al, Au, Ag, etc.

EXAMPLES

Specific conditions which are not mentioned in the examples follow usual conditions or conditions recommended by the manufacturer.

This example shows a method for manufacturing a diode device having electro-luminescence and photoelectric response properties, wherein the diode device includes a photo detection layer made of $CuInS_2/ZnS$ nanocrystalline prepared by a 6-mercaptohexanol ligand exchange method. The specific steps are as follows:

Step S1, forming a first electrode

Cleaning: the first electrode was made of ITO, surfaces of the first electrode was wiped with a cotton wool dipped with a detergent, then the first electrode was flushed with deionized water and soaked into detergent aqueous solution for ultrasonic treatment for 15 minutes, followed by ultrasonic treatment in deionized water, acetone and isopropanol each for 15 min respectively. Cleaning was carried out twice, and finally the cleaned first electrode was soaked into isopropanol for later use.

Plasma treatment: the cleaned first electrode was blown with nitrogen gas, and was placed with the front side upward in a chamber of a plasma cleaner for plasma treatment for 5 min.

Step S2, forming a hole transport layer including a PEDOT: PSS material layer and a TFB material layer i) Forming a First Hole Transport Layer: TFB Material Layer 80 mg of P-type organic small molecule TFB was dispersed into 10 mL of chlorobenzene. The obtained solution was ultrasonically treated or stirred for 30 min, and then centrifuged at a speed of 3000 rpm for 5 min to obtain a precursor solution for the first hole transport layer. After the centrifugation, the obtained solution was filtered with a filter having a 0.22 μm filter head to ensure that large particles in the precursor solution for the first hole transport layer which will affect the film quality were filtered out.

Then, the first electrode was placed on a suction cup of a spin coater, and 80 μL of the precursor solution for first hole transport layer transferred with a pipette was uniformly dripped onto the first electrode and spin-coated at a revolving speed of 5000 rpm for 60 s. After the spin coating, annealing was performed at 150° C. for 30 min to form a first hole transport layer;

ii) Forming a Second Hole Transport Layer: PEDOT: PSS Material Layer

20 μL of polyethylene glycol (PEG) was added to 4 mL of PEDOT: PSS PH1000 (purchased from Wuhan Zhuoxin Technology Co., Ltd.), and the obtained solution was stirred for 24 h to obtain a precursor solution for the second hole transport layer. After stirring, filtration was carried out with a filter having a 0.45 μm filter head to ensure that large particles in the precursor solution for the second hole transport layer which will affect the film quality were filtered out.

Then, the first electrode with the first hole transport layer was placed on the suction cup of the spin coater, and 80 μL of the precursor solution for the second hole transport layer transferred with the pipette was uniformly dripped onto the first hole transport layer and spin-coated at a revolving speed of 5000 rpm for 60 s. After the spin coating, annealing was performed at 150° C. for 30 min to form a second hole transport layer.

Step S3, Form a functional layer including at least one sub-functional layer on the hole transport layer, wherein each sub-functional layer includes a photo-detection layer and an electroluminescent layer which were stacked and a difference of energy barriers between the photo-detection layer and the electroluminescent layer is not more than 1.5 eV.

Forming a photo-detection layer: a $CuInS_2/ZnS$ nanocrystalline layer Taking $CuInS_2$ as an example of the copper indium sulfide compound, the specific steps for preparing it were as follows:

mixing zinc acetate, oleylamine and dodecyl mercaptan with a predetermined proportion and heating at 130° C. to obtain a zinc stock solution, wherein the oleylamine had a volume of 20 ml, the dodecyl mercaptan had a volume of 60 ml, and the zinc acetate had a quantity of 30 mmol;

mixing copper iodide, indium acetate, dodecyl mercaptan, oleic acid and octadecene with a predetermined proportion and degassing under vacuum for 20 minutes to obtain a mixed solution including a $CuInS_2$ core structure, wherein the dodecyl mercaptan had a volume of 10 ml; the oleic acid had a volume of 5 ml; the octadecene had a volume of 100 ml; the copper iodide had a quantity of 4 mmol; and the indium acetate had a quantity of 16 mmol;

heating the mixed solution to 230° C. under the protection of nitrogen flow and keeping the reaction for 15 minutes;

injecting the zinc stock solution into the mixed solution at a speed of 1 ml/min to obtain a corresponding reaction solution, thereby cladding the $CuInS_2$ core structure;

cooling the reaction solution to 180° C., injecting a predetermined amount of 6-mercaptohexanol into the reaction solution in one step and keeping reaction for 15 minutes to complete in-situ ligand exchange, so as to obtain a mixed solution of copper indium sulfide nanocrystalline, wherein the zinc stock solution was 80 ml, and the 6-mercaptohexanol had a quantity of 200 mmol; and extracting the mixed solution 2 to 3 times with n-hexane to obtain a copper indium sulfide nanocrystalline, and drying the copper indium sulfide nanocrystalline for 15 minutes at 60° C. to obtain a $CuInS_2/ZnS$ nanocrystalline material.

Then, uniformly dripping 100 μL of $CuInS_2/ZnS$ nanocrystalline solution transferred with the pipette onto the second hole transport layer and spin-coating it at a revolving speed of 4000 rpm for 60 s. After the spin coating, annealing at 80° C. for 10 min to form a photo detection layer having a thickness of 50 nm.

Forming an electroluminescent layer: oil-soluble CdSe nanocrystalline layer uniformly dripping 100 μL of conventional oil-soluble CdSe nanocrystalline (purchased from Nanjing MKNANO Tec Co., Ltd., model MK1542) transferred with the pipette onto the photo detection layer and spin-coating it at a revolving speed of 4000 rpm for 60 s. After the spin coating, annealing at 80° C. for 10 min to form an electroluminescent layer having a thickness of 50 nm.

Step S4, forming an electron transport layer on the functional layer 300 mg of N-type metal oxide ZnO and 20 mg of nanocrystalline material CdSe-MCH containing hydroxyl groups in surface ligand were dispersed in 10 mL of ethanol. The obtained solution was ultrasonically treated for 10 min and then centrifuged at a speed of 5000 rpm for 4 min to obtain a precursor solution for the electron transport layer. After the centrifugation, the obtained solution was filtered with the filter having a 0.22 μm filter head to ensure that large particles in the precursor solution for the electron transport layer which will affect the film quality were filtered out.

Then, 100 μL of the electron transport layer precursor solution transferred with the pipette was uniformly dripped onto the functional layer and spin-coated at a revolving speed of 3000 rpm for 50 s. After the spin coating, annealing was carried out at 100° C. for 20 min to form an electron transport layer.

Step S5, forming a second electrode: aluminum

An aluminum film was formed on the electron transport layer by a high vacuum plating method as a second electrode.

So far, the diode device having electro-luminescence and photoelectric response properties was manufactured.

After the diode device was manufactured, the diode device was mounted in the diode apparatus as shown in FIGS. 2A and 2B to test the properties of the diode device.

For example, when a forward bias is applied by the power supply to the diode device 100, the diode device 100 is turned on and the electroluminescent layer 1012 could emit Light-E, thereby obtaining a voltage-brightness curve shown in FIG. 3. As shown in FIG. 3, when the forward bias applied to two ends of the diode device 100 reaches about 9 V, the brightness of the light emitted by the diode device 100 reaches a peak.

When a reverse bias or zero bias is applied by the power supply to the diode device 100 and the Light-R received by the diode device 100 is adjusted, the diode device turned off and does not emit light, but the photo current output by the diode device 100 may be measured, thereby obtaining a photo current-time relationship diagram shown in FIG. 4. It is easily understood that the diode device 100 outputs photo current in the period of receiving light, whereas it does not output photo current in the period of not receiving light.

It is understood that the above embodiments are only exemplary ones used to illustrate the principles of the present disclosure, but the present disclosure is not limited to these. For ordinary technical personnel in this field, various variations and improvements can be made without breaking away from the spirit and essence of the present disclosure, and these variations and improvements are also regarded as the scope of protection of the present disclosure.

The invention claimed is:

1. A diode device, comprising a first electrode, a hole transport layer, a functional layer, an electron transport layer and a second electrode which are stacked,
    wherein the functional layer comprises at least one sub-functional layer each comprising a photo detection layer and an electroluminescent layer which are stacked;
    a difference of energy barriers between the photo-detection layer and the electroluminescent layer is not more than 1.5 eV;
    the photo-detection layer comprises a nanocrystalline derived from a copper indium sulfide compound; and
    the electroluminescent layer comprises an oil-soluble nanocrystalline.

2. The diode device according to claim 1, wherein the copper indium sulfide compound comprises any one of $CuInS_2$, $CuInSe_2$, $CuInS_xSe_{2-x}$, $CuInZn_yS_{2+y}$, $CuIn_yGa_{1-y}Se_2$ and the combinations thereof, wherein $0<x<2$ and $0<y<1$.

3. The diode device according to claim 1, wherein the first electrode comprises a transparent electrode material, and the second electrode comprises a conductive metal material.

4. The diode device according to claim 1, wherein the photo detection layer has a thickness of 20 nm to 1000 nm and the electroluminescent layer has a thickness of 20 nm to 1000 nm.

5. A diode apparatus, comprising at least one diode device according to claim 1.

6. The diode apparatus according to claim 5, further comprises a power supply, a trigger and a switch,
    wherein an input end of the trigger is electrically coupled to the second electrode, a first output end of the trigger is electrically coupled to the first electrode, a second output end of the trigger is electrically coupled to a control end of the switch, and the switch are turned on when receiving photo current output from the second output end;
    an output end of the power supply is electrically coupled to the first end of the switch, an input end of the power supply is electrically coupled to the second electrode, and the second end of the switch is electrically coupled to the first electrode.

7. The diode apparatus according to claim 6, wherein the power supply is capable of outputting a pulse signal, and the diode apparatus further comprises an adjuster capable of adjusting a high-level voltage value of the pulse signal output by the power supply according to the photo current value output by the diode device in a low-level state of the pulse signal.

8. A method for controlling the diode apparatus according to claim 6,
    applying a forward bias to the diode device such that the diode device emits light; or
    applying a reverse bias or zero bias to the diode device such that the diode device outputs photo current.

9. The method for controlling the diode apparatus according to claim 8, wherein the trigger is configured to detect the photo current output by the diode device; and
    when the photo current is greater than a preset threshold, the trigger outputs a control signal for controlling the switch to be turned on, so that the power supply applies a bias to the diode device to make it be turned on and emit light.

10. A method for manufacturing a diode device, comprising:
    forming a first electrode;
    forming a hole transport layer;

forming a functional layer comprising at least one sub-functional layer on the hole transport layer, wherein each sub-functional layer comprises a photo-detection layer and an electroluminescent layer which are stacked and a difference of energy barriers between the photo-detection layer and the electroluminescent layer is not more than 1.5 eV;

forming an electron transport layer on the functional layer; and forming a second electrode;

wherein the photo detection layer comprises a nanocrystalline derived from a copper indium sulfide compound and the electroluminescent layer comprises an oil-soluble nanocrystalline.

11. The method for manufacturing a diode device according to claim 10, wherein forming a sub-functional layer comprises:

coating a photo detection layer solution comprising a first solvent and a nanocrystalline derived from a copper indium sulfide compound; and coating an electroluminescent layer solution comprising a second solvent and an oil-soluble nanocrystalline;

where the first solvent and the second solvent are orthogonal to each other.

12. The method for manufacturing a diode device according to claim 11, wherein a copper indium sulfide compound layer is formed by using an alcohol-soluble phase inversion method, so as to further obtain the photo-detection layer.

13. The method for manufacturing a diode device according to claim 12, wherein the alcohol-soluble phase inversion method is selected from the group consisting of a 6-mercaptohexanol ligand exchange method, a 2-mercapto-3-butanol ligand exchange method, a 3-mercapto-1-propanol ligand exchange method or a 2,3-dimercaptopropanol ligand exchange method.

14. The method for manufacturing a diode device according to claim 10, wherein the copper indium sulfide system compound comprises any one of $CuInS_2$, $CuInSe_2$, $CuInS_xSe_{2-x}$, $CuInZn_yS_{2+y}$, $CuIn_yGa_{1-y}Se_2$ and the combinations thereof, wherein $0<x<2$ and $0<y<1$.

15. The method for manufacturing a diode device according to claim 10, wherein the first electrode comprises a transparent electrode material and the second electrode comprises a conductive metal material.

16. The method for manufacturing a diode device according to claim 10, wherein the photo detection layer has a thickness of 20 nm to 1000 nm, and the electroluminescent layer has a thickness of 20 nm to 1000 nm.

* * * * *